(12) United States Patent
Su et al.

(10) Patent No.: US 8,546,212 B2
(45) Date of Patent: Oct. 1, 2013

(54) SEMICONDUCTOR DEVICE AND FABRICATING METHOD THEREOF

(75) Inventors: Hao Su, Singapore (SG); Hang Hu, Singapore (SG); Hong Liao, Singapore (SG)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 33 days.

(21) Appl. No.: 13/332,392

(22) Filed: Dec. 21, 2011

(65) Prior Publication Data

US 2013/0161754 A1    Jun. 27, 2013

(51) Int. Cl.
*H01L 21/8238*     (2006.01)

(52) U.S. Cl.
USPC .......... 438/216; 438/197; 438/199; 438/218; 438/221; 438/233; 257/E21.202

(58) Field of Classification Search
None
See application file for complete search history.

(56) References Cited

U.S. PATENT DOCUMENTS

| | | | |
|---|---|---|---|
| 5,960,270 A * | 9/1999 | Misra et al. .................. 438/197 |
| 6,033,963 A | 3/2000 | Huang |
| 6,653,698 B2 | 11/2003 | Lee |
| 6,858,483 B2 | 2/2005 | Doczy |
| 6,921,711 B2 | 7/2005 | Cabral, Jr. |
| 6,953,719 B2 | 10/2005 | Doczy |
| 6,967,131 B2 | 11/2005 | Saenger |
| 6,972,225 B2 | 12/2005 | Doczy |
| 7,029,966 B2 | 4/2006 | Amos |
| 7,056,794 B2 | 6/2006 | Ku |
| 7,064,050 B2 | 6/2006 | Cabral, Jr. |
| 7,064,066 B1 | 6/2006 | Metz |
| 7,074,680 B2 | 7/2006 | Doczy |
| 7,112,851 B2 | 9/2006 | Saenger |
| 7,126,199 B2 | 10/2006 | Doczy |
| 7,148,548 B2 | 12/2006 | Doczy |
| 7,153,734 B2 | 12/2006 | Brask |
| 7,157,378 B2 | 1/2007 | Brask |
| 7,183,184 B2 | 2/2007 | Doczy |
| 7,220,635 B2 | 5/2007 | Brask |
| 7,316,949 B2 | 1/2008 | Doczy |
| 7,317,231 B2 | 1/2008 | Metz |
| 7,326,610 B2 | 2/2008 | Amos |
| 7,355,281 B2 | 4/2008 | Brask |
| 7,390,709 B2 | 6/2008 | Doczy |
| 2002/0121699 A1 | 9/2002 | Cheng |
| 2007/0262451 A1 | 11/2007 | Rachmady |
| 2009/0039433 A1 | 2/2009 | Yang |
| 2009/0057769 A1 | 3/2009 | Wei |
| 2009/0159978 A1 | 6/2009 | Matsubara |
| 2009/0186458 A1 | 7/2009 | Yu |
| 2010/0052066 A1 | 3/2010 | Yu |
| 2010/0065926 A1 | 3/2010 | Yeh |
| 2010/0068877 A1 | 3/2010 | Yeh |

* cited by examiner

*Primary Examiner* — Kyoung Lee
(74) *Attorney, Agent, or Firm* — Winston Hsu; Scott Margo (57) ABSTRACT

A manufacturing method of a semiconductor device includes the following steps. First, a substrate is provided. At least one gate trench and a first inter-layer dielectric layer are formed on the substrate. A work function metallic layer is then formed in the gate trench. A first contact hole is then formed in the first inter-layer dielectric layer. A main conductive layer is formed in the gate trench and the first contact hole simultaneously.

14 Claims, 9 Drawing Sheets

SEMICONDUCTOR DEVICE AND FABRICATING METHOD THEREOF

BACKGROUND OF THE INVENTION

1. Field of the Invention

The present invention relates to a semiconductor device and a manufacturing method thereof, more particularly to a semiconductor device and a manufacturing method thereof wherein a contact hole is formed on a doping region before forming a metal gate structure.

2. Description of the Prior Art

Poly-silicon is conventionally used as a gate electrode in semiconductor devices, such as metal-oxide-semiconductors (MOS). With the trend towards scaling down the size of semiconductor devices, conventional poly-silicon gates face problems such as boron penetration and unavoidable depletion effect leading to inferior performances. Because of these problems, the equivalent thickness of the gate dielectric layer increases, reducing the gate capacitance, and lowering a driving force of the devices. Therefore, work function metals that are suitable for use as high dielectric constant (high-k) gate dielectric layers are employed to replace the conventional poly-silicon gates as control electrodes.

In a complementary metal-oxide semiconductor (CMOS) device, one of the dual work function metal gate structures is used in an NMOS device and the other one is used in a PMOS device. It is well known that compatibility and process controls for the dual metal gate structure is more complicated, while thickness and composition controls for materials used in dual metal gate structure methods are more precise. The conventional dual metal gate structure methods are categorized into gate first processes and gate last processes. In a conventional dual metal gate structure method with the gate first process, both the annealing process for forming the source/drain ultra-shallow junction and the silicide process are performed after forming the metal gate structure. After performing the annealing process with a strict thermal budget, it is found that a flat band voltage (Vfb) does not increase nor decrease linearly with a decreasing EOT of the high-k gate dielectric layer; but a roll-off issue is observed. The gate last process is developed to improve the Vfb roll-off issue and avoid generating leakage current due to re-crystallization of the high-k gate dielectric layer occurring in high-temperature processes, to widen material choices for the high-k gate dielectric layer and to widen the choice for metal gate structure in the gate first process.

In the conventional gate last process, a sacrificial gate or a replacement gate is provided, and known processes are performed to build a normal MOS transistor. Then, the sacrificial/replacement gate is removed to form a gate trench. Metals are filled into the gate trench according to the electrical needs. For example, a work function metal layer, a barrier layer and a main electrode layer are formed in the gate trench. The process described above is generally regarded as a replacement metal gate (RMG) process. In the conventional process, an etching process is performed to form a contact plug on a doping region after the RMG process. An inter-layer dielectric with a substantial thickness over the doping region has to be penetrated by the contact plug, and it becomes more difficult to control the etching process.

SUMMARY OF THE INVENTION

One of the objectives of the present invention is to provide a semiconductor device and a manufacturing method thereof. The contact hole on the doping region is formed before forming the metal gate structure to improve the manufacturing process of the semiconductor device and enhance its properties.

According to a preferred embodiment of the present invention, a manufacturing method of a semiconductor device includes the following steps. First, a substrate is provided. At least a sacrificial gate structure is formed on the substrate, at least one doping region is formed in the substrate at both sides of the sacrificial gate structure, and a first inter-layer dielectric (ILD) layer is formed to cover the doping region. A gate trench is then formed in the sacrificial gate structure. A first metal layer is subsequently formed in the gate trench. A first contact hole is then formed in the first inter-layer dielectric layer. Then a second metal layer is formed in the gate trench and the first contact hole simultaneously.

According to another preferred embodiment of the present invention, a manufacturing method of a semiconductor device includes the following steps. First, a substrate is provided. At least a first semiconductor unit, at least a second semiconductor unit, and a first ILD layer are formed on the substrate. The first semiconductor unit has a first sacrificial gate structure formed therein, and at least a first doping region formed in the substrate at both sides of the first sacrificial gate structure; the second semiconductor unit has a second sacrificial gate structure formed therein, and at least a second doping region formed in the substrate at both sides of the second sacrificial gate structure; and the first ILD layer is formed to cover the first doping region and the second doping region. A first gate trench is then formed in the first sacrificial gate structure, and a second gate trench is formed in the second sacrificial gate structure. A first metal layer is subsequently formed in the first gate trench and the second gate trench. A plurality of first contact holes are formed in the first ILD layer for at least partially exposing the first doping region or the second doping region. A second metal layer is formed in the first gate trench, the second gate trench, and the first contact holes simultaneously.

According to a preferred embodiment of the present invention, a semiconductor device includes a substrate, a high-k gate dielectric layer, a metal gate structure, a doping region, a first ILD layer, and a doping contact plug. The high-k gate dielectric layer is disposed on the substrate. The metal gate structure is disposed on the high-k gate dielectric layer. The doping region is disposed in the substrate at both sides of the metal gate structure. The first ILD layer is disposed on the doping region, and the first ILD layer has a first contact hole at least partially exposing the doping region. The doping contact plug is disposed in the first contact hole. The metal gate structure comprises a work function layer and a main conductive layer; the first contact hole comprises the main conductive layer, and the main conductive layer contacts the sidewalls of the first contact hole directly.

According to another preferred embodiment of the present invention, a semiconductor device includes a substrate, a first semiconductor unit, a second semiconductor unit, a first ILD layer, and a plurality of doping contact plugs. The first semiconductor unit and a second semiconductor unit are disposed on the substrate. The first semiconductor unit comprises a first metal gate structure and at least a first doping region disposed in the substrate at both sides of the first gate structure, and the second semiconductor unit comprises a second metal gate structure and at least a second doping region disposed in the substrate at both sides of the second metal gate structure. The first ILD layer is disposed on the first doping region and the second doping region, and the first ILD layer has a plurality of first contact holes at least partially exposing the first doping region or the second doping region. The doping contact plugs are respectively disposed in each of the first contact holes. The first metal gate structure and the second metal gate structure comprise a first work function layer and a main conductive layer, the first contact hole, the first metal gate structure and the second metal gate structure comprise the main conductive layer. And the main conductive layer is connected to the sidewalls of the first contact hole directly.

In the present invention, the metal gate structure may avoid being damaged during the formation of the contact holes because the replacement metal gate process is completed after forming the contact holes. The process window of the etching process for forming the contact hole may accordingly be improved, and the process yield as well as the device quality may also be enhanced.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
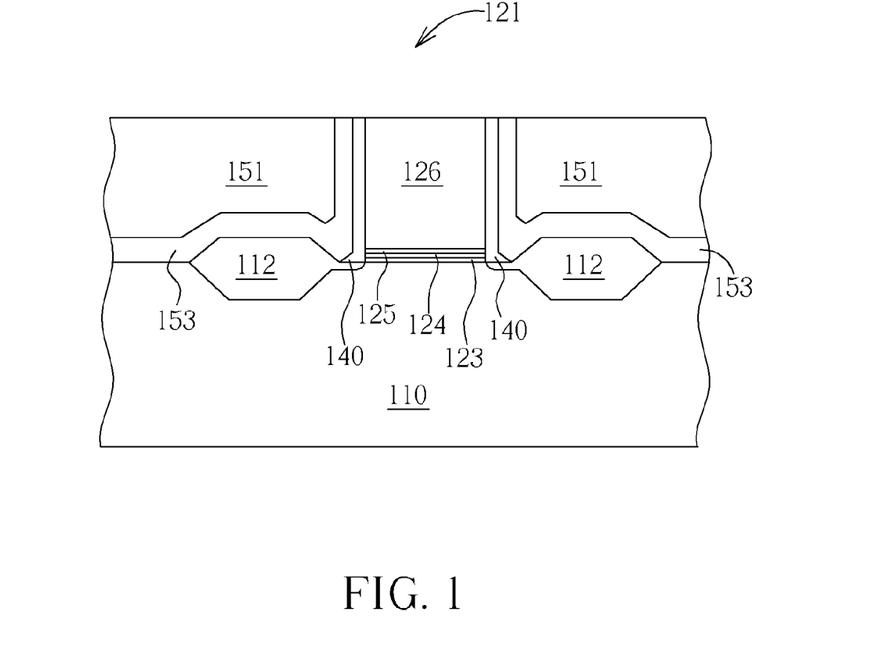
FIGS. 1-5 are schematic diagrams illustrating a manufacturing method of the semiconductor device according to the first preferred embodiment of the present invention.
Figure 2:
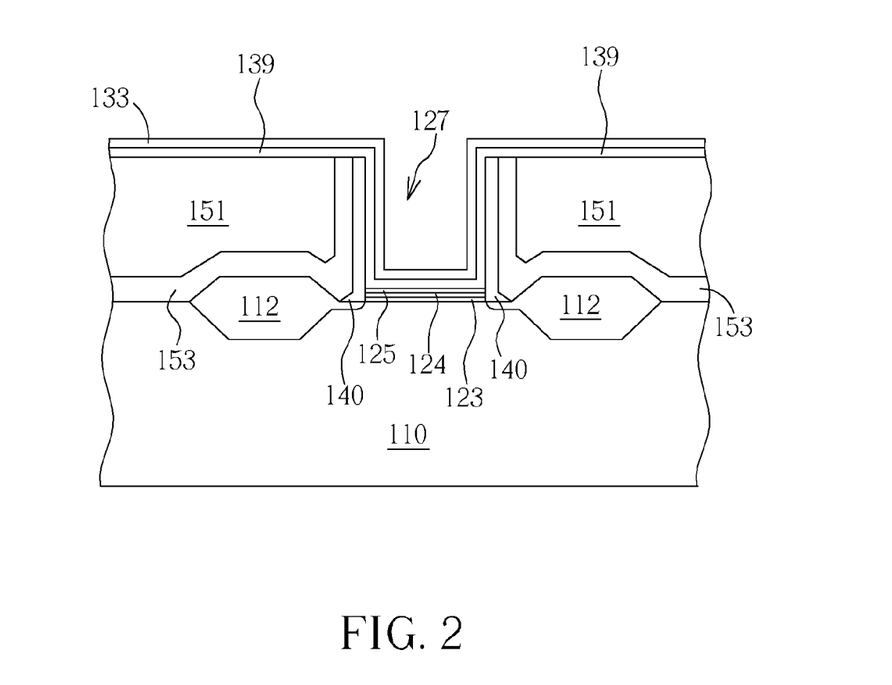

Please refer to FIGS. 1-5. FIGS. 1-5 are schematic diagrams illustrating a manufacturing method of the semiconductor device according to the first preferred embodiment of the present invention. The manufacturing method of the semiconductor device in this embodiment includes the following steps. First, as shown in FIG. 1, a substrate 110 is provided. A sacrificial gate structure 121 is formed on the substrate 110, a doping region 112 is formed in the substrate 110 at both sides of the sacrificial gate structure 121, and a first ILD layer 151 is formed to cover the doping region 112. In this embodiment, the sacrificial gate structure 121 may include a high dielectric constant (high-k) gate dielectric layer 124 and a sacrificial gate material layer 126 such as a poly-silicon material layer. The high-k gate dielectric layer 124 may be formed between the substrate 110 and the sacrificial gate material layer 126. Additionally, in this embodiment, a spacer 140 may be formed on both sides of the sacrificial gate structure 121, a CESL 153 may be formed between the first ILD layer 151 and the doping region 112, a barrier layer 125 may be formed between the sacrificial gate material layer 126 and the high-k gate dielectric layer 124, and a buffer layer 123 may be formed between the substrate 110 and the high-k gate dielectric layer 124, wherein the doping region 112 may comprises a source/drain region and a LDD (lightly doped drain) region, but the present invention is not limited to this. As shown in FIG. 2, the sacrificial gate material layer 126 may then be removed to form a gate trench 127 in the sacrificial gate structure 121. Then a work function metal layer 133 is formed at least in the gate trench 127.

Figure 3:
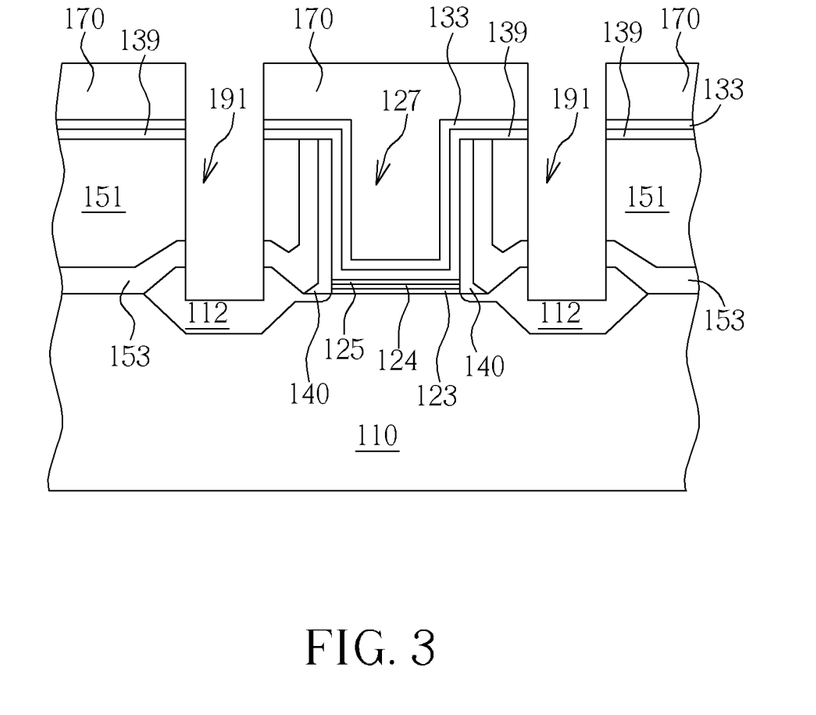

Afterwards, as shown in FIG. 3, at least a first contact hole 191 may be formed in the patterned photoresist layer 170, work function metal layer 133, first ILD layer 151 and the CESL 153 by a photo-etch process for at least partially exposing each of the doping regions 112. It is worth noting that a bottom barrier layer 139 may be selectively formed in the gate trench 127 before forming the first contact hole 191 trench, but not limited thereto.

Figure 4:
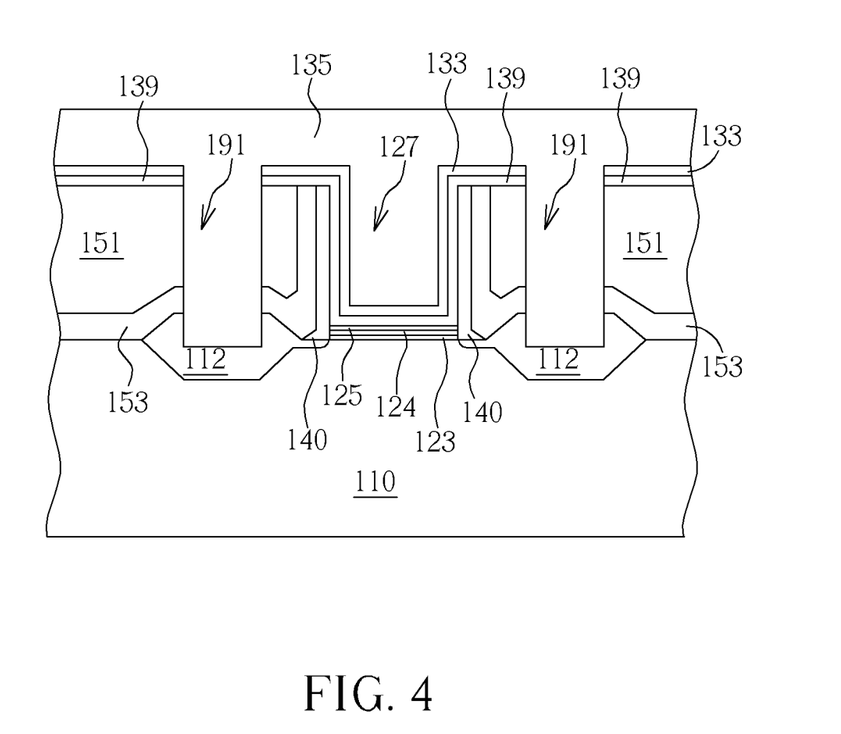

After removing the photoresist layer 170, as shown in FIG. 4, a main conductive layer 135 is then formed at least in the gate trench 127 and each of the first contact holes 191 simultaneously. In this embodiment, the main conductive layer 135 may be a multi-materials layer, comprising a low resistance material and a barrier material. The components of the main conductive layer 135 in the gate trench 127 are preferably identical to the components of the main conductive layer 135 in the first contact hole 191, but the present invention is not limited to this, and the components of the main conductive layer 135 in the gate trench 127 may be different from the components of the main conductive layer 135 in each of the first contact holes 191.

Figure 5:
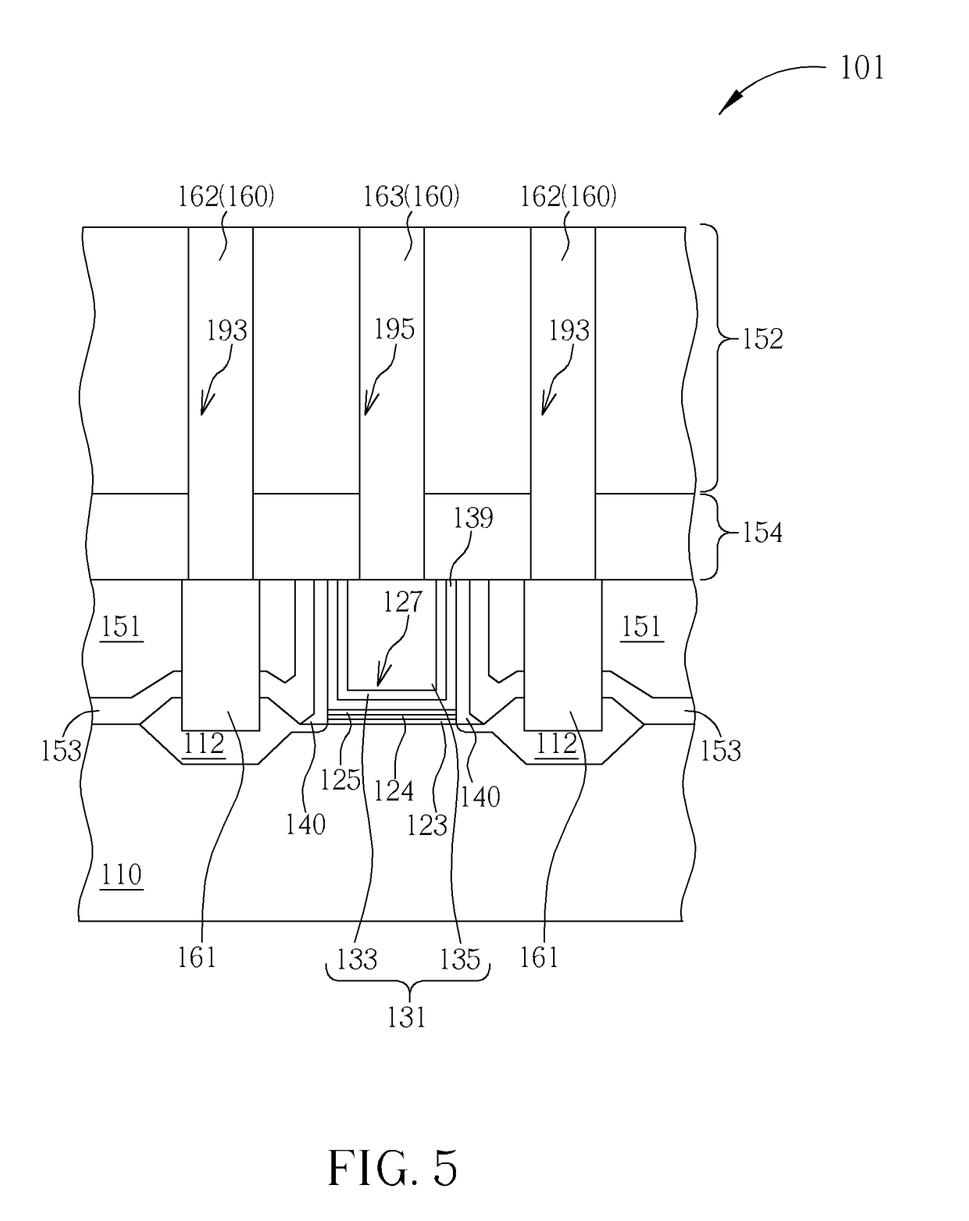

As shown in FIG. 5, a portion of the main conductive layer 135, the work function metal layer 133, the bottom barrier layer 139 are removed down to the surface of the first ILD layer 151 by one or multiple planarization process, such as a chemical mechanical polishing (CMP) process, in order to separate the main conductive layer 135 and the work function metal layer 133 in the gate trench 127 from the main conductive layer 135 in each of the first contact holes 191, and to form the metal gate structure 131 and the doping contact plug 161 respectively. A second ILD layer 152 may then be formed to cover the substrate 110 and the main conductive layer 135, i.e. the second ILD layer 152 may be formed to cover the metal gate structure 131 and the doping contact plug 161. Additionally, in this embodiment, an NDC layer 154 may be selectively formed before forming the second ILD layer 152, but not limited thereto. A gate contact hole 195 and at least a second contact hole 193 may then be formed in the second ILD layer 152 and the NDC layer 154. The gate contact hole 195 at least partially exposes the main conductive layer 135 in the gate trench 127, and the second contact hole 193 at least partially exposes the main conductive layer 135 in the first contact hole 191. In addition, the manufacturing method of the semiconductor device in this embodiment may further include filling the gate contact hole 195 and the second contact hole 193 with a conductive material 160, such as aluminum (Al), tungsten (W), copper (Cu), Ti (titanium), titanium nitride (TiN), tantalum (Ta), tantalum nitride (TaN), titanium aluminide (TiAl), and titanium aluminum oxide (TiAlO), but not limited thereto. The conductive material 160 is then partially removed by a planarization process to form a gate contact plug 163 and at least a second doping contact plug 162. A semiconductor device 101 shown in FIG. 5 may be obtained by performing the manufacturing method described above. In other words, both the metal gate structure 131 and the doping contact plug 161 in the semiconductor device 101 include the work function metal layer 133 and the main conductive layer 135.

In the present invention, the work function metal layer 133 is first formed in the gate trench 127, and then the main conductive layer 135 in the gate trench and the first contact hole 191 are formed simultaneously. A process, such as an etching process, to form the first contact hole 191 would not damage the metal gate structure 131 because the metal gate structure 131 is formed after forming the first contact hole 191, which avoids the problem of overhanging caused by the high aspect ratio of the first contact hole. Additionally, in the semiconductor device 101, the second ILD layer 152 is disposed over the metal gate structure 131 and the doping contact plug 161. It is also easier to form the gate contact hole 195 and the second contact hole 193 simultaneously through a controlled etching process, because the layers that have to be removed over the metal gate structure 131 and over the doping contact plug 161 are identical, and the widths and depths of the gate contact hole 195 and each of the second contact holes 193 are similar too. The gate contact plug 163 and the second doping contact plugs 162 are formed in the second ILD layer 152. The gate contact plug 163 is electrically connected to the metal gate structure 131 and each of the second doping contact plugs 162 is electrically connected to the doping contact plug 161. The semiconductor device in this embodiment may be employed to form a semiconductor device with a metal gate, such as a SRAM, but not limited thereto.

In this embodiment, the substrate 110 may be a semiconductor substrate, such as a silicon substrate, a silicon containing substrate or a silicon-on-insulator (SOI) substrate. The high-k gate dielectric layer 124 may be selected from a group comprising hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide (HfZrO4), strontium bismuth tantalite ($SrBi_2Ta_2O_9$, SBT), lead zirconate titanate ($PbZr_xTi_{1-x}O_3$, PZT) and barium strontium titanate ($Ba_xSr_{1-x}TiO_3$, BST). The work function metal layer 133 may include an intrinsic work function, and the work function metal layer 133 may be a p-type work function metal layer, an n-type work function metal layer, or a composite layer including both the p-type work function layer and the n-type work function layer for optimizing the work function of the metal gate structure 131. For example, the work function of an NMOS is generally comprised between 3.9 eV and 4.3 eV, and the work function of a PMOS is generally comprised between 4.8 eV and 5.2 eV, but not limited thereto. The work function metal layer 133 may include titanium nitride (TiN), titanium carbide (TiC), tantalum nitride (TaN), tantalum carbide (TaC), tungsten carbide (WC), titanium tri-aluminide (TiAl3) or aluminum titanium nitride (TiAlN), but not limited thereto. In addition, the work function metal layer 123 may be a single-layered structure or a multi-layered structure. The first ILD layer 151 and the second ILD layer 152 may be a silicon oxide layer or a silicon nitride layer. The spacer 140 may be a single layer structure or a multilayer structure formed by materials such as silicon nitride or silicon oxide. The barrier layer 125 may be employed to protect the high-k gate dielectric layer 124 during the process of removing the sacrificial gate material layer 126. The barrier layer 125 may include titanium, titanium nitride, tantalum, or tantalum nitride. The main conductive layer 135 may be a multi-materials layer, including a low resistance conductive material such as aluminum (Al), tungsten (W), copper (Cu), titanium aluminide (TiAl), and titanium aluminum oxide (TiAlO),and a barrier material such as TiN or TaN, but not limited thereto. In addition, the doping region 112 may include an epitaxial layer such as a silicon germanium epitaxial layer or a silicon carbide epitaxial layer, and a metal silicide (not shown) may be further formed on the doping region 112 to improve the contact performances.

Figure 6:
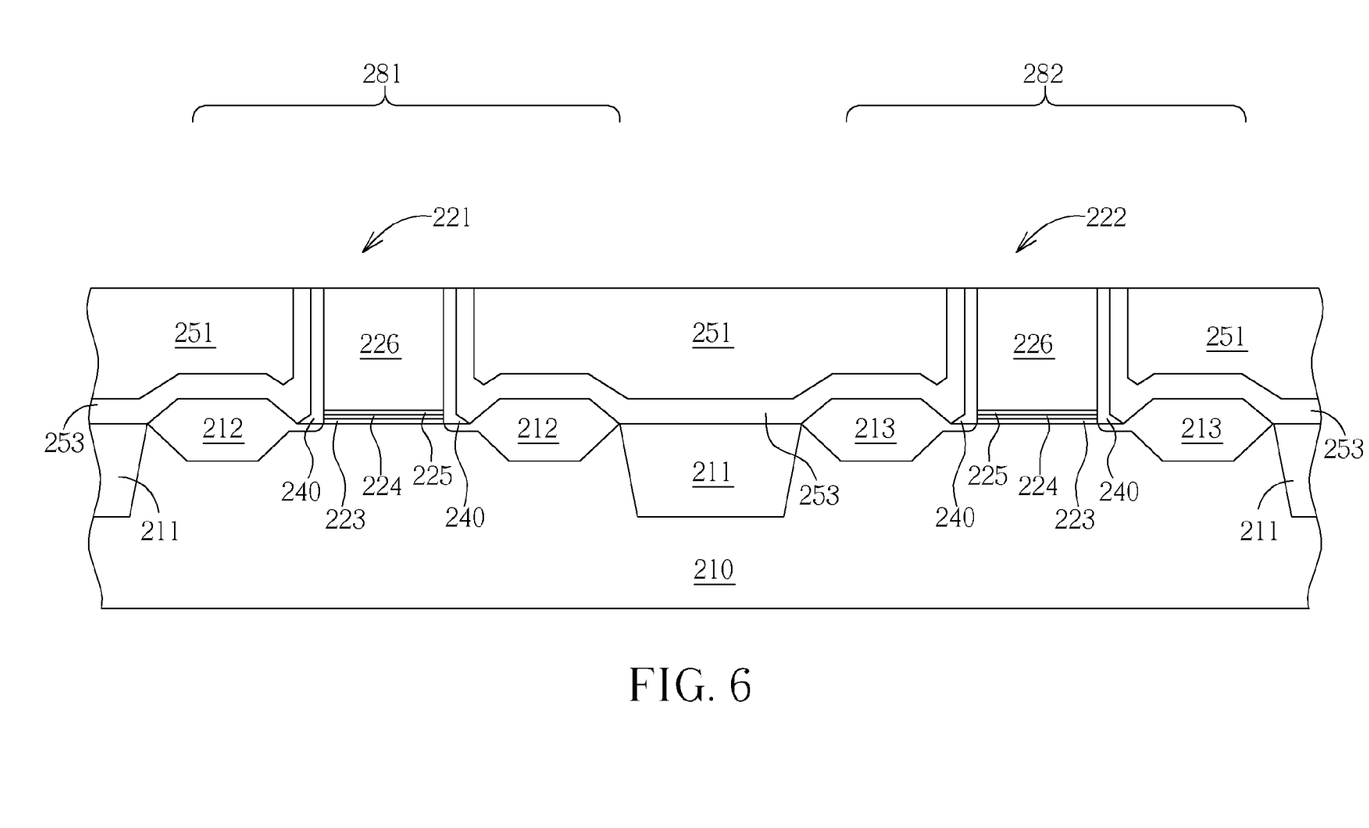
FIGS. 6-10 are schematic diagrams illustrating a manufacturing method of the semiconductor device according to the second preferred embodiment of the present invention.

Please refer to FIGS. 6-10. FIGS. 6-10 are schematic diagrams illustrating a manufacturing method of the semiconductor device according to the second preferred embodiment of the present invention. The manufacturing method of the semiconductor device in this embodiment includes the following steps. First, as shown in FIG. 6, a substrate 210 is provided. A first semiconductor unit 281, a second semiconductor unit 282, and a first ILD layer 251 are formed on the substrate 210. A STI 211 may be formed in the substrate 210 between the first semiconductor unit 281 and the second semiconductor unit 282. A first sacrificial gate structure 221 is formed in the first semiconductor unit 281, and two first doping regions 212 are formed in the substrate 210 at both sides of the first sacrificial gate structure 221. A second sacrificial gate structure 222 is formed in the second semiconductor unit 282, and two second doping regions 213 are formed in the substrate 210 at both sides of the second sacrificial gate structure 222, wherein the first doping region 212 and the second doping region 213 may comprise a source/drain region and a LDD (lightly doped drain) region respectively. A first ILD layer 251 is formed to cover the first doping region 212 and the second doping region 222. In this embodiment, the first sacrificial gate structure 221 and the second sacrificial gate structure 222 may include a high-k gate dielectric layer 224 and a sacrificial gate material layer 226. The high-k gate dielectric layer 224 may be formed between the substrate 210 and the sacrificial gate material layer 226. Additionally, in this embodiment, a spacer 240 may be formed on both sides of the first sacrificial gate structure 221 and the second sacrificial gate structure 222 respectively, a CESL 253 may be formed between the first ILD layer 251 and the first doping region 212 and the second doping region 213. A barrier layer 225 may be formed between the sacrificial gate material layer 226 and the high-k gate dielectric layer 224, and a buffer layer 223 may be formed between the substrate 210 and the high-k gate dielectric layer 224, but the present invention is not limited to this.

Figure 7:
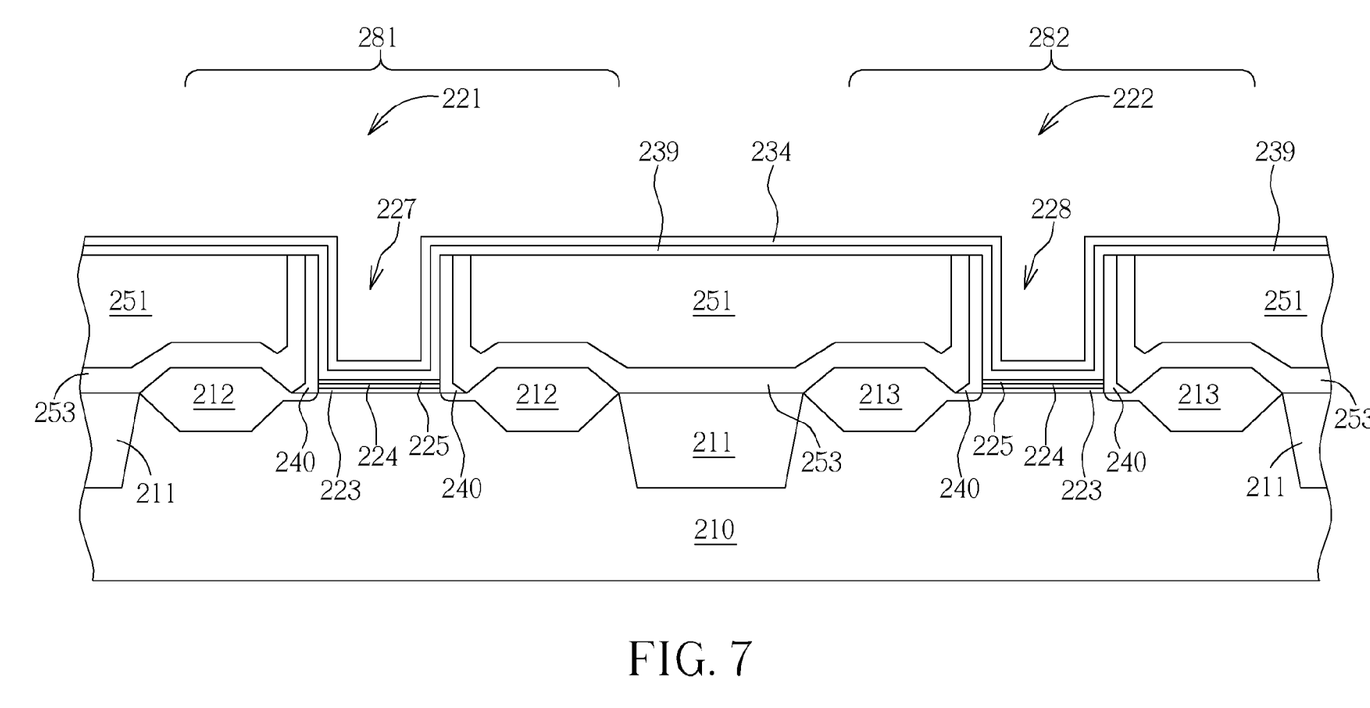

As shown in FIG. 7, the sacrificial gate material layer 226 is then removed to form a first gate trench 227 and a second gate trench 228 in the first sacrificial gate structure 221 and the second sacrificial gate structure 222 respectively. Then a first work function metal layer 234 is formed at least in the first gate trench 227 and the second gate trench 228, as shown in FIG. 7.

Afterwards, the first work function metal layer 234 in the first gate trench is removed using a photo-etch process, with the first work function metal layer 234 remaining only in the second semiconductor device 282, then a second work function metal layer 233 is formed in the first gate trench 227 and the second gate trench 228 respectively.

Figure 8:
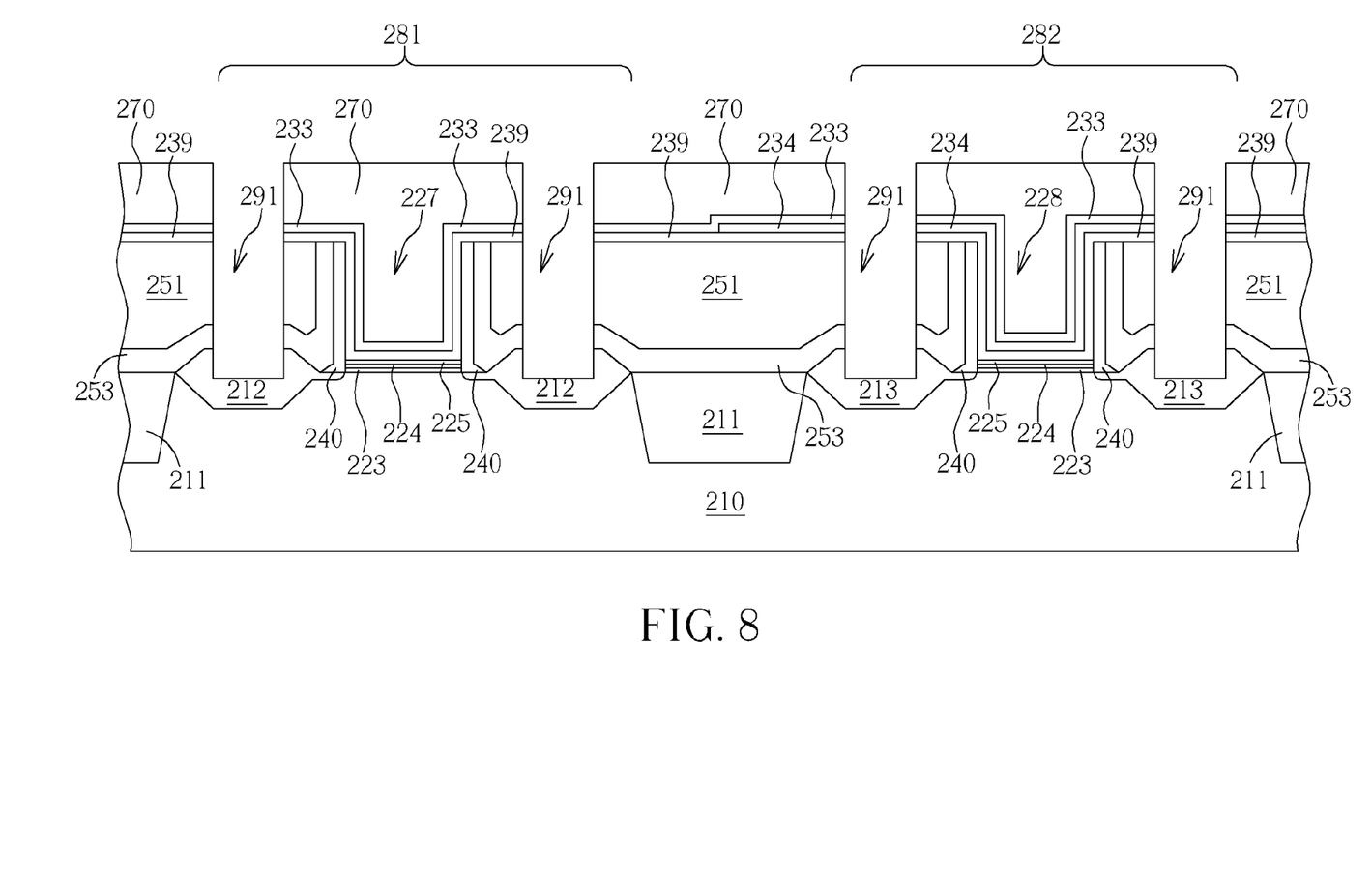

As shown in FIG. 8, a patterned photoresist layer 270 is formed by a photo-etch process, then a plurality of first contact holes 291 may be formed in the second work function metal layer 233, the first work function metal layer 234, the first ILD layer 251 and the CESL 253, at least partially exposing the first doping region 212 and the second doping region 213. It is worth noting that a bottom barrier layer 239 and a second work function metal layer 234 may be selectively formed in the first gate trench 227 and the second gate trench 228 before forming the first contact hole 291, but the present invention is not limited to this.

Figure 9:
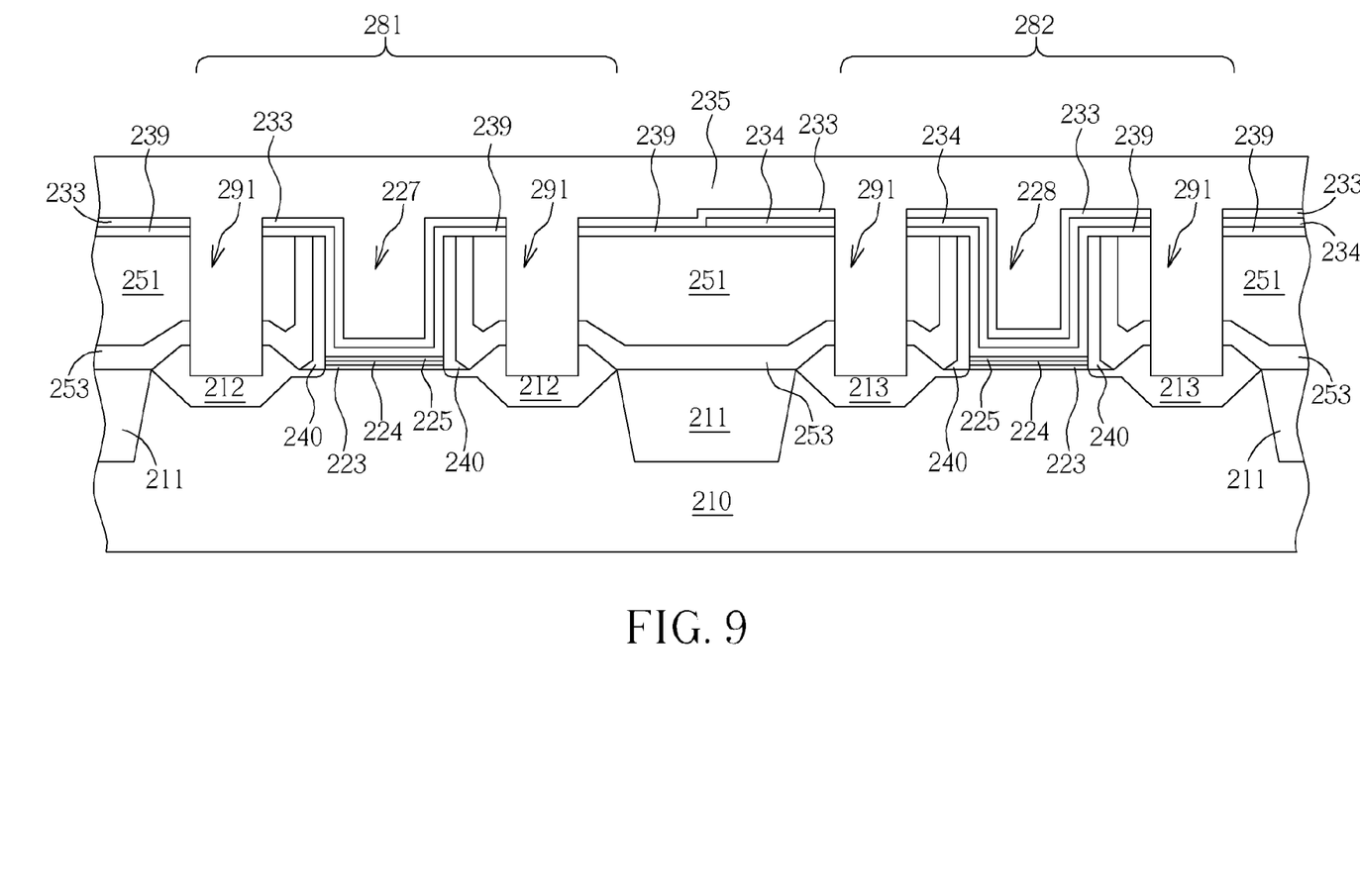

As shown in FIG. 9, a main conductive layer 235 is subsequently formed in the first gate trench 227, the second gate trench 228 and each of the first contact holes 291. The main conductive layer 235 in the first gate trench 227, the second gate trench 228 and the first contact holes 291 may be formed by a same film-forming process simultaneously, but not limited thereto.

Figure 10:
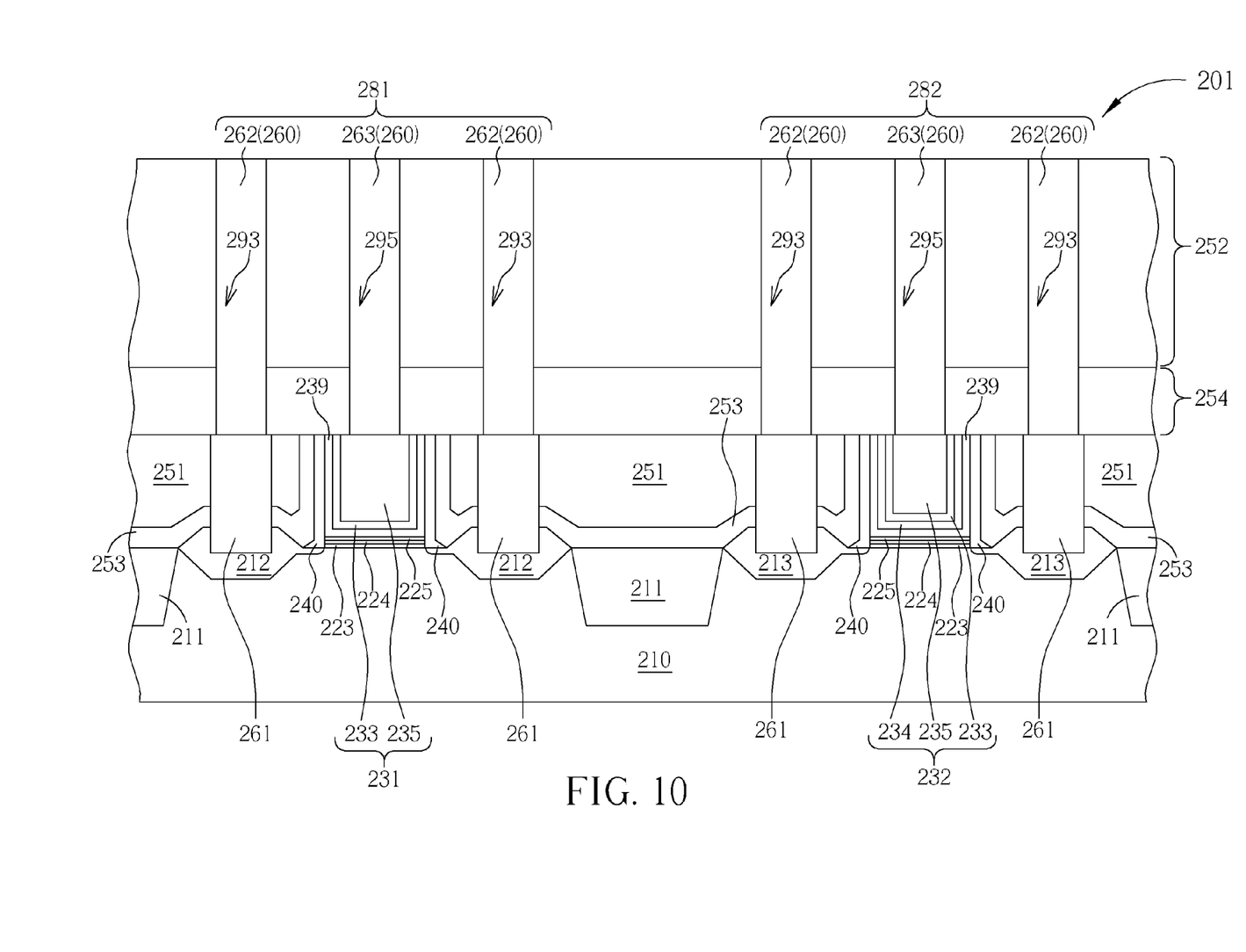

As shown in FIG. 10, a part of the main conductive layer 235, a part of the first work function metal layer 234, and a part of the second work function metal layer 233 may then be removed to expose the surface of the first ILD layer 251 by a planarization process, such as a chemical mechanical polishing process, in order to separate the main conductive layer 235, the first work function metal layer 234, and the second work function metal layer 233 in the first gate trench 227, in the second gate trench 228 and in each of the first contact holes 291, and form the first metal gate structure 231, the second metal gate structure 232, and a plurality of doping contact plugs 261 respectively. A second ILD layer 252 may then be formed to cover the substrate 210 and the main conductive layer 235, i.e. the second ILD layer 252 may be formed to cover the first metal gate structure 231, the second metal gate structure 232, and the doping contact plugs 261. Additionally, in this embodiment, an NDC layer 254 may be selectively formed before forming the second ILD layer 252, but not limited thereto. Two gate contact holes 295 and a plurality of second contact holes 293 may then be formed in the second ILD layer 252 and the NDC layer 254. The gate contact holes 295 at least partially expose the main conductive layer 235 in the first gate trench 227 or in the second gate trench 228, and each of the second contact holes 293 at least partially exposes the main conductive layer 235 in each of the first contact holes 291. In addition, the manufacturing method of the semiconductor device in this embodiment may further include filling the gate contact holes 295 and the second contact holes 293 with a conductive material 260. The conductive material 260 is then partially removed by a planarization process to form a second doping contact plug 262 and a gate contact plug 263. By performing the manufacturing method described above, a semiconductor device 201 shown in FIG. 10 may be obtained. The material properties of the components in this embodiment are similar to the second preferred embodiment mentioned above and will not be redundantly described. In this embodiment, a conductive type of the first semiconductor unit 281 may be an n-type and a conductive type of the second semiconductor unit 282 may be a P-type, but not limited thereto.

Additionally, in the semiconductor device 201 of this embodiment, the first metal gate structure 231, the second metal gate structure 232 and the doping contact plug 261 all include the main conductive layer 235. The second metal gate structure 232 may further include the first work function metal layer 234, disposed between the second work function metal layer 233 and the substrate 210. A process, such as an etching process, for forming the first contact hole 291 may not damage the first metal gate structure 231 and the second metal gate structure 232, because the first metal gate structure 231, the second metal gate structure 232 and the first contact holes 291 are formed simultaneously. Moreover, the invention resolves the overhanging problem caused by high aspect ratios.

Additionally, in the semiconductor device 201, the second ILD layer 252 is disposed over the first metal gate structure 231, the second metal gate structure 232 and the doping contact plug 261. It is easier to control an etching process for forming the gate contact holes 295 and the second contact holes 293 simultaneously because the layers that have to be removed over the first metal gate structure 231, over the second metal gate structure 232, and over the doping contact plug 261 are identical, and the widths and depths of the gate contact holes 295 and the second contact holes 293 are similar too. The gate contact plugs 263 and the second doping contact plugs 262 are formed in the second ILD layer 252. Each of the gate contact plugs 263 is electrically connected to the first metal gate structure 231 or the second metal gate structure 232, and each of the second doping contact plugs 262 is electrically connected to the doping contact plug 261.

Another manufacturing method of the semiconductor device according to an exemplary embodiment of the present invention may further include the first metal gate structure 231 and the second gate structure 232 to be not formed simultaneously. In other words, the first metal gate structure 231 and the doping contact plug 261 may be formed after the second metal gate structure 232 was formed. Otherwise, the second metal gate structure 232 and the doping contact plug 261 may be formed after the first metal gate structure 231 was formed. But the present invention is not limited to this. In those two embodiments above, the diffusion plug 261 does not comprise any work function metal layer either.

It is worth noting that the "gate-last for high-k first" process is performed in all the embodiments mentioned above, and the high-k gate dielectric layer has a "−" shaped profile structure, but the high-k gate dielectric layer in the present invention is not limited to this and may have a "U" shaped profile structure when the high-k last process is performed in other embodiments of the present invention. For example, forming a high-k gate dielectric layer, a work function metal layer in the gate trench, and then etching to form at least a contact hole in the work function metal layer, high-k gate dielectric layer, ILD layer and the CESL, to expose each of the doping region. Finally, a main conductive layer is formed in the gate trench and the contact hole simultaneously, so that each high-k gate dielectric layer and work function metal layer in metal gate has a "U" shaped profile structure, and the diffusion plugs do not comprise work function metal layer.

To summarize the above descriptions, in the manufacturing method of the semiconductor device of the present invention, the contact holes are formed before completing the replacement metal gate process, and preferably after the work function metal layer is formed. This way the metal gate structure may avoid being damaged during the formation of the contact holes, and resolve the overhanging problem caused by the high aspect ratio. The process window and the process limitations of the etching process for forming the contact holes may accordingly be improved, and the process yield and the device quality may also be enhanced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor device, comprising:
    providing a substrate having at least a first semiconductor unit, at least a second semiconductor unit and a first ILD layer formed thereon, wherein the first semiconductor unit has a first sacrificial gate structure formed therein, the second semiconductor unit has a second sacrificial gate structure formed therein, and the first ILD layer is formed on the substrate; and
    forming a first gate trench in the first sacrificial gate structure; and
    forming a second gate trench in the second sacrificial gate structure; and
    forming a first metal layer on the surface of the first gate trench and the second gate trench; and
    forming a plurality of first contact holes in the first metal layer and the first ILD layer; and
    forming a second metal layer in the first gate trench, the second gate trench and the first contact hole simultaneously.

2. The manufacturing method of the semiconductor device of claim 1, wherein a conductive type of the first semiconductor is an n-type and a conductive type of the second semiconductor is a p-type.

3. The manufacturing method of the semiconductor device of claim 1, wherein the first metal layer comprises a second work function metal layer.

4. The manufacturing method of the semiconductor device of claim 1, wherein the second metal layer comprises a main conductive layer.

5. The manufacturing method of the semiconductor device of claim 1, further comprising forming a first work function metal layer in the second gate trench before forming the first work function metal layer.

6. The manufacturing method of the semiconductor device of claim 1, wherein a high-k gate dielectric layer formed in the first gate sacrificial structure and the second gate sacrificial structure, and the high-k gate dielectric layer is formed between the substrate and the first gate layer.

7. The manufacturing method of the semiconductor device of claim 3, wherein the first contact hole may be formed after the second work function metal layer is formed.

8. The manufacturing method of the semiconductor device of claim 5, wherein the first contact hole may be formed after the first work function metal layer is formed.

9. The manufacturing method of the semiconductor device of claim 6, wherein the high dielectric constant (high-k) dielectric layer has a "–" or "U" shaped profile structure.

10. A semiconductor device, comprising:
a substrate;
a first semiconductor unit and a second semiconductor unit disposed on the substrate, wherein the first semiconductor unit comprises a first metal gate structure, and the second semiconductor unit comprises a second metal gate structure;
a first ILD layer disposed on the substrate, and;
a plurality of contact holes, formed in the ILD layer, wherein the first metal gate structure and the second metal gate structure comprise a second work function metal layer and a main conductive layer; and the contact holes comprise the main conductive layer, wherein the main conductive layer is directly connected to the sidewalls of the first contact holes.

11. The semiconductor device of claim 10, wherein the contact holes do not comprise the second work function metal layer.

12. The semiconductor device of claim 10, wherein the second metal gate structure further comprises a first work function metal layer disposed between the second work function metal layer and the substrate.

13. The semiconductor device of claim 10, wherein a conductive type of the first semiconductor unit is an n-type and a conductive type of the second semiconductor unit is a p-type.

14. The semiconductor device of claim 10, wherein both the first semiconductor unit and the second semiconductor unit comprise a high-k gate dielectric layer.

* * * * *